US010580570B2

(12) United States Patent
Pechstein et al.

(10) Patent No.: US 10,580,570 B2
(45) Date of Patent: Mar. 3, 2020

(54) DISTRIBUTOR MODULE AND MEASURING SYSTEM FORMED THEREWITH

(71) Applicant: Endress + Hauser Conducta Gesellschaft für Mess- und Regeltechnik mbH + Co. KG, Gerlingen (DE)

(72) Inventors: Torsten Pechstein, Radebul (DE); Sven-Matthias Scheibe, Dresden (DE)

(73) Assignee: Endress+Hauser Conducta GmbH+Co. KG, Gerlingen (DE)

( * ) Notice: Subject to any disclaimer, the term of this patent is extended or adjusted under 35 U.S.C. 154(b) by 1058 days.

(21) Appl. No.: 14/483,886

(22) Filed: Sep. 11, 2014

(65) Prior Publication Data

US 2015/0032386 A1    Jan. 29, 2015

Related U.S. Application Data

(62) Division of application No. 13/126,505, filed as application No. PCT/EP2009/063631 on Oct. 19, 2009, now abandoned.

(30) Foreign Application Priority Data

Oct. 30, 2008    (DE) .................. 10 2008 053 920

(51) Int. Cl.
*H01F 38/14* (2006.01)
*H02J 50/10* (2016.01)
(Continued)

(52) U.S. Cl.
CPC ............ *H01F 38/14* (2013.01); *G01D 21/00* (2013.01); *G01R 27/26* (2013.01); *H02J 50/10* (2016.02);
(Continued)

(58) Field of Classification Search
CPC ........ G01D 21/00; G01R 27/26; H01F 38/14; H05K 5/0017; H05K 5/06
(Continued)

(56) References Cited

U.S. PATENT DOCUMENTS

| 4,157,637 | A |   | 6/1979 | Orlov et al. |
|---|---|---|---|---|
| 4,517,637 | A | * | 5/1985 | Cassell .................. G05B 15/02 700/9 |

(Continued)

FOREIGN PATENT DOCUMENTS

| DE | 199 49 649 A1 | 6/2000 |
|---|---|---|
| DE | 199 38 460 A1 | 2/2001 |

(Continued)

*Primary Examiner* — Sujoy K Kundu
*Assistant Examiner* — Terence E Stifter, Jr.
(74) *Attorney, Agent, or Firm* — Mark A. Logan; PatServe (57) ABSTRACT

The distributor module serves for distributing electrical power to at least two connected measuring devices (S1, S2) and for forwarding to at least one superordinated electronic data processing unit (NLU) information concerning at least one physical, measured variable transmitted from the connected at least two measuring devices. For this, the distributor module comprises a module housing (100) as well as an electronics module placed within the module housing (100). Additionally present in the distributor module are two or more connection systems, one for each of the measuring devices delivering measured data, with, in each case, a transformer coil placed within the module housing and connected to the electronics module for the forming a data as well as electrical energy transmitting, inductively coupling interface, as well as at least one connection system for the at least one data processing unit, wherein each of the transformer coils is placed, in each case, within a plug connector element composed at least partially of plastic or other synthetic material and serving for forming a plug (Continued)

connector coupling. Moreover, it is provided that the distributor module is applied in a measuring system serving for measuring at least one physical and/or at least one chemical, measured variable.

9 Claims, 6 Drawing Sheets (51) Int. Cl.
    *G01D 21/00*     (2006.01)
    *H04Q 9/00*     (2006.01)
    *G01R 27/26*     (2006.01)
    *H04B 5/00*     (2006.01)
    *H05K 5/00*     (2006.01)
    *H05K 5/06*     (2006.01)
    *H01F 19/08*     (2006.01)

(52) U.S. Cl.
    CPC ............ *H04B 5/0037* (2013.01); *H04Q 9/00* (2013.01); *H05K 5/0017* (2013.01); *H05K 5/06* (2013.01); *H01F 2019/085* (2013.01); *H01F 2038/143* (2013.01); *H04Q 2209/30* (2013.01); *H04Q 2209/845* (2013.01); *H04Q 2209/88* (2013.01); *Y10T 307/297* (2015.04); *Y10T 307/461* (2015.04)

(58) Field of Classification Search
    USPC .......................................................... 702/30
    See application file for complete search history.

(56) References Cited

U.S. PATENT DOCUMENTS

| | | | |
|---|---|---|---|
| 5,253,537 A | 10/1993 | Tomita et al. | |
| 5,764,928 A | 6/1998 | Lanctot | |
| 6,037,857 A * | 3/2000 | Behrens | G05B 19/0423 307/326 |
| 6,145,392 A | 11/2000 | Kathan et al. | |
| 6,366,346 B1 | 4/2002 | Nowak et al. | |
| 6,366,436 B1 | 4/2002 | Maier et al. | |
| 6,476,520 B1 * | 11/2002 | Bohm | H01F 38/14 307/104 |
| 6,556,447 B2 | 4/2003 | Cudini et al. | |
| 6,705,898 B2 | 3/2004 | Pechstein et al. | |
| 6,711,446 B2 | 3/2004 | Kirkpatrick et al. | |
| 6,822,431 B2 | 11/2004 | Masuda et al. | |
| 6,888,453 B2 | 5/2005 | Lutz | |
| 6,898,980 B2 | 5/2005 | Behm et al. | |
| 7,620,463 B2 * | 11/2009 | Zips | G05B 15/02 455/572 |
| 7,844,365 B2 * | 11/2010 | Brewer | G05B 19/05 307/1 |
| 2006/0254911 A1 * | 11/2006 | Lindmueller | H01F 38/14 204/424 |
| 2007/0019560 A1 * | 1/2007 | Brewer | H04L 12/10 370/252 |
| 2007/0090963 A1 | 4/2007 | Schaefer et al. | |
| 2007/0183315 A1 * | 8/2007 | Feucht | H04L 1/24 370/220 |
| 2007/0217091 A1 | 10/2007 | Florin et al. | |

FOREIGN PATENT DOCUMENTS

| | | |
|---|---|---|
| DE | 199 61 157 A1 | 7/2001 |
| DE | 201 02 038 U1 | 8/2002 |
| DE | 102 20 450 A1 | 11/2003 |
| DE | 10218606 A1 | 11/2003 |
| DE | 10313639 A1 | 10/2004 |
| DE | 10 2004 033 052 A1 | 2/2006 |
| DE | 10 2006 062 184 A1 | 6/2008 |
| DE | 102006062184 A1 | 6/2008 |
| DE | 102007020823 A1 | 11/2008 |
| DE | 102007041237 A1 | 3/2009 |
| DE | 102007041238 A1 | 3/2009 |
| DE | 102007048812.4 A1 | 4/2009 |
| DE | 102007053223 A1 | 5/2009 |
| DE | 102008029956 A1 | 12/2009 |
| DE | 102008045314 A1 | 3/2010 |
| EP | 0062531 A1 | 10/1982 |
| EP | 1 100 152 A2 | 5/2001 |
| EP | 1108992 A1 | 6/2001 |
| EP | 1403832 A1 | 3/2004 |
| EP | 1669726 A1 | 6/2006 |
| EP | 1221023 B1 | 8/2007 |
| EP | 1 885 085 A1 | 2/2008 |
| WO | 9735190 A1 | 9/1997 |
| WO | 2005015130 A2 | 2/2005 |
| WO | 2007124834 A2 | 11/2007 |
| WO | 200859019 A2 | 5/2008 |
| WO | 2008058991 A1 | 5/2008 |
| WO | 2008077737 A1 | 7/2008 |
| WO | 2008080758 A1 | 7/2008 |
| WO | 2008098954 A1 | 8/2008 |

* cited by examiner

DISTRIBUTOR MODULE AND MEASURING SYSTEM FORMED THEREWITH

CROSS-REFERENCE TO RELATED APPLICATIONS

This application is a Divisional of pending U.S. application Ser. No. 13/126,505 filed on Apr. 28, 2011, which is a National Stage of PCT/EP2009/063631 filed on Oct. 19, 2009, which claims the benefits of German Application Serial No. 10 2008 053 920.1, filed on Oct. 30, 2008, entitled "Distributor Module and Measuring System Formed Therewith" which are hereby incorporated by reference in their entirety.

The invention relates to a distributor module for distributing electrical power to at least two connected measuring devices and for forwarding to at least one superordinated electronic data processing unit, especially a data processing unit processing data corresponding to the measured variable and/or a data processing unit controlling the distributor module, information concerning at least one physical, measured variable, especially a measured variable serving as a process parameter of an industrial and/or automated process to be monitored, transmitted from the at least two connected measuring devices. Furthermore, the invention relates to a measuring system formed by such a distributor module.

Such modularly composed measuring systems or individual components thereof used in industrial measurement technology are described, for example, in U.S. Pat. Nos. 6,145,392, 6,366,346, 6,476,520, 6,705,898, 6,822,431, 6,898,980, 5,764,928, 5,253,537, US-A 2007/0090963, EP-A 1 403 832, EP-A 1 108 992, EP-A 12 21 023, EP-A 062 531, WO-A 08/058,991, WO-A 08/059,019, WO-A 07/124,834, WO-A 05/015130, WO-A 97/35190, DE-A 10 2006 062184, DE-A 102 18 606 A1, DE-A 103 13 639, WO-A 08/098,954, WO-A 08/077,737 or the not prepublished German patent applications 102007053223.9, 102007041238.1 or 102008029956.1 and comprise usually a sensor module with a measuring transducer—usually a measuring transducer held on the container, or on the pipeline system, as the case may be, and/or contacting the medium, or at least partially extending thereinto—for registering at least one measured variable and for producing at least one primary signal influenced by the measured variable, and a sensor electronics connected with the measuring transducer, in given cases also a sensor electronics formed by means of a microprocessor, for converting the primary signal delivered by the measuring transducer into a sensor signal, in given cases also a digital sensor signal. The measuring transducers are, in such case, often exposed to the most difficult operating conditions, such as, for instance, corrosive chemicals, extreme heat, high pressure and/or strong vibrations, etc.

Measuring systems of the type being discussed further include a transmitter module connected mechanically, especially rigidly, with the sensor module to form a measuring device. The transmitter module includes a transmitter electronics electrically coupled with the sensor electronics and formed in given cases by a microprocessor for converting the sensor signal delivered from the sensor module—in given cases, transmitted from the sensor electronics to the transmitter electronics via a galvanic separation point—into the measured values representing at least one measured variable. For example, the initially mentioned DE-A 102 18 606, as well as the German patent applications 102008045314.5, 102008029956.1 and 102007041238.1, show in each case a potentiometric measuring device with a measuring transducer for registering an, in such case potentiometric, measured variable, for instance, a pH value or a redox potential, as well as an inductively coupling interface for the output of measured data, which is dependent on a potentiometric measured variable, to a transmitter module. In such a case, the measuring device shown includes a digital data memory, which is fixedly connected with the measuring transducer and is insofar an integral component of the sensor module.

The aforementioned galvanically separated interface can be, for example, an inductive interface formed by means of a transformer for feeding the sensor electrical power, especially on the basis of an impressed electrical current and/or an impressed voltage. The transmission of data such as for instance, measured data generated on the part of sensor module, or configuration and parameter data provided for the sensor module by the transmitter module, can occur, for example, via the same inductive interface through a corresponding modulation of the electrical current and/or voltage on the part of each data transmitting module, thus for example, by means of an alternating electrical current modulated as regards amplitude and/or frequency and/or by means of an alternating voltage modulated as regards amplitude and/or frequency. Construction and operation of such modulators, for instance, using an amplitude- (ASK) or a frequency keying method (FSK) or also corresponding demodulators are well known to those skilled in the art and also described, for example, in the initially mentioned German patent applications 102007020823.7 or 102007041237.3 and, respectively, WO-A 08/080,758.

Industrial-strength measuring systems, especially those for operation in explosion endangered regions, must also furthermore satisfy very high safety requirements in regard to explosion prevention. In such a case, this especially concerns the certain prevention of sparks or at least assurring that sparks possibly occurring in the interior of a closed space have no effects on the environment, in order to safely avoid the possiblity of potentially triggering an explosion. As explained for this, for example, also in the initially named EP-A 1 669 726, U.S. Pat. Nos. 6,366,436, 6,556,447 or US-A 2007/0217091, different ignition protection types are distinguished in connection with explosion protection. These are correspondingly manifested in each case also in relevant standards and norms concerning electrical operating means for explosion endangered regions. Examples of these standards are US-American standard FM3600, international standard IEC 60079-18 and the standards DIN EN 50014 ff. Thus e.g. according to the European Norm EN 50 020:1994, explosion protection is met, when devices are embodied according to the therein defined ignition protection type or the protection class with the name "Intrinsic Safety" (Ex-i). In this protection class, the values for the electrical variables, electrical current, voltage and power, in a device each have to lie below a predetermined limit value at any time in each case. The three limit values are so selected, that in the case of malfunction, e.g. a short circuit, the maximum occurring heat is not sufficient to produce ignition sparks. The electrical current is held under the predetermined limit values e.g. by resistances, the voltage e.g. by Zener diodes, and the power through a corresponding combination of current and voltage limiting components. In the European standard EN 50 019:1994, another protection class is set forth with the name "Increased Safety" (Ex-e). In the case of devices, which are embodied according to this protection class, the ignition or explosion protection is achieved by having the spatial distances between two different electrical potentials be so large that a spark formation cannot occur in the case of malfunction, due to the distance. However, this can lead to circumstances that circuit arrangements must have very large dimensions, in order to satisfy these requirements. In European standard EN 50 018:1994 additionally, the ignition protection type "Pressure-Resistant Encapsulation" (Ex-d) is provided as another protection class. Measuring systems or system modules that are embodied according to this protection class must have a pressure resistant housing, through which is assured that an explosion occurring in the interior of the housing cannot be transmitted to the external space. Pressure resistant housings are embodied with comparatively thick walls, in order that they have a sufficient mechanical strength. In the USA, Canada, Japan and other countries there are standards comparable to the aforementioned European standards. Consequently, a transmitter housing, usually hermetically sealed, most often also pressure, or explosion resistant, in given cases filled with potting compound for the transmitter electronics, serves to accommodate the transmitter electronics, while the sensor electronics is arranged in a corresponding, separate sensor housing that also at least partially receives the measuring transducer.

Measuring systems of the type being discussed are additionally most often integrated into a superordinated electronic data processing system serving for example, for the automated control of a manufacturing plant comprising the measuring system, in given cases an electronic data processing system, which is very widely topologically extended, such as for instance, a data processing system in the form of a process control system (PCS) and/or in the form of a measuring and control loop formed by a programmable logic controller (PLC). Integration is accomplished, in such cases, for example by means of a digital fieldbus, such as PROFIBUS, MODBUS etc., for instance, and/or by means of a radio connection, to which data processing system measured values produced by the respective measuring system are forwarded near in time, encapsulated in given cases in a corresponding telegram. The transmitted measured values can be further processed by means of such data processing systems and visualized e.g. on monitors as corresponding measurement results and/or converted to control signals for other field devices embodied as actuating devices, such as e.g. magnetic-valves etc. Since modern industrial measuring systems can most often also be directly monitored and in given cases controlled and/or configured by such control computers; in a corresponding manner, operating data intended for the measuring device is most often equally dispatched via the aforementioned data transmission networks, which are hybrid as regards the transmission physics and/or the transmission logic. In the data processing system, a comprehensive control and monitoring of the manufacturing plant can thus occur based on a plurality of measured values, and complex parameters derived therefrom, produced by means of multiple such measuring systems.

Measuring systems of the type being discussed, as shown for example in the German patent applications 102008029956.1, or 102008045314.5 mentioned initially, for the connection of the superordinated data processing system and measuring system, or for the display of measured values, additionally comprise a data processing unit—placed most often comparatively widely removed from the transmitter module or the measuring device formed therewith, or in a less critical environment in comparison to the actual measuring point. This data processing unit additionally can also be connected to a field bus present in given cases. Connecting cables, usually interposed between the transmitter module and data processing unit, serve for the connection of the respective measuring device to the correspondingly associated data processing unit, most often likewise embodied as a self-sufficient measurement transmitter module, wherein the interfaces of the measuring device and data processing unit corresponding with one another as well as the connecting cable itself usually meet and, respectively, support the requirements set by established industrial standards, such as for instance, EIA-485, EIA-232 or EIA-422, respectively UART (Universal Asynchronous Receiver Transmitter protocol), as regards construction, circuitry and data coding, respectively, transmission. The connecting cables can furthermore also be "intelligent" connecting cables with integrated signal processing, such as described for example in the not prepublished German patent application 102007048812.4.

Data processing units of the aforementioned type usually also serve suitably to convert measured values delivered by the measuring device, as well as also parameter values signaling, in given cases, a current operating state, or a current configuration of the measuring device, and to condition such values, measured values and parameter values, corresponding to the requirements of downstream data transmission networks, for example, suitably to digitize them or in given cases to convert them into a corresponding telegram, for example, a fieldbus capable telegram, and/or to evaluate them and, in given cases, display them on-site. For such a purpose, the electronics of such a data processing unit is provided with corresponding transmitter circuits, which further process the sensor measured data received by the respective measuring system into more complex measured values derived therefrom and, in given cases, convert such to forwardable telegrams.

Besides the evaluating circuits required for processing and converting the measured values delivered by each connected field device, such data processing units most often have also electrical supply circuits serving to supply the connected measuring device with electrical energy and providing a corresponding internal supply voltage for the entire measuring system, in given cases fed directly by the connected fieldbus. A supply circuit can, in such case, for example, associated, in each case, with exactly one measuring system and together with the evaluating circuit associated with the respective measuring device—for example, unite to form a single data processing unit serving as measurement transmitter and/or as fieldbus adapter—be accommodated in a shared electronics housing of metal and/or plastic or other synthetic material, e.g. formed as top hat rail module. However, it is also quite usual to accommodate supply circuits and evaluating circuits, in each case, in separate electronic housings, in given cases spatially remote from one another, and to wire them each correspondingly with one another via external lines.

In the case of modularly composed measuring systems, it is additionally quite usual, as shown for example in U.S. Pat. No. 6,705,898 or EP-A 1 108 992, to replace at times one of the two modules on-site after start-up of the measuring system with a new, structurally equal one, or at least one of the same type. As shown in the initially mentioned U.S. Pat. No. 6,705,898, for example, the sensor housing and the transmitter housing therefor can be embodied, in each case, as plug connector elements complementary to one another for example as described in the initially mentioned German patent application 102007048812.4 or U.S. Pat. No. 6,705,898, in order to form a pluggable connector coupling with an integrated inductive interface galvanicly isolated from an electrical point of view, and connected with one another to be releasable from a structural point of view. Wear susceptible electrical contacts can be avoided by use of such a pluggable connector coupling, since the transmission of both electrical energy and information between the modules can be accomplished by means of inductive coupling alone. Since such a pluggable connector coupling does not need to have exposed plug contacts and thus also corresponding openings, the two plug connector elements and thus also the two modules can be very simple embodied hermetically sealed. The surface material (for example an electrically non-conductive plastic or other synthetic material) of the plug connector elements can be matched to the respective intended use or to the particular corrosive medium.

The aforementioned inductively coupled interfaces implemented by means of a pluggable connector coupling are especially suitable for measuring systems, for instance such as for registering potentiometric measured variables, with measuring transducers with a short nominal lifetime, since the same measuring transducer must be regularly replaced as a result of consumption or wear phenomena. However, a special problem of conventional measuring systems of the aforementioned type is that the measuring point implemented therewith—if only temporarily, yet nevertheless recurringly—at times must be taken completely out of operation and thus a continuous monitoring of the relevant process or the plant is not readily assured. Especially for critical applications, this problem can currently be remedied only by the installation of two or more of such complete measuring systems, which can then be taken out of operation offset in time. However, the application of multiple measuring systems for forming a redundant or practically interruption free operable measuring point makes the measuring as a whole enormously more expensive, both in regards to the acquisition costs and especially as well as in regard to the operating costs because of the correspondingly increased number of individual components and the increased calibration and maintenance needs associated therewith.

Consequently, an object of the invention is to improve such modularly composed measuring systems having an inductive interface for data and energy transmission, toward the goal of enabling an interruption free measuring operation, also in the case of the application of measuring transducers that must be recurringly replaced.

For achieving the object, the invention resides in a distributor module for distributing electrical power to at least two connected measuring devices and for forwarding to at least one superordinated electronic data processing unit, especially one processing data corresponding to the measured variable and/or controlling the distributor module, information concerning at least one physical, measured variable, especially one serving as a process parameter of an industrial and/or automated process to be monitored, transmitted from the at least two connected measuring devices. The distributor module comprises:
a module housing, especially one embodied to be water spray and/or explosion and/or pressure resistant;
an electronics module placed within the module housing, especially an electronics module embodied to be protected from explosion;
a first connection system for a first measuring device delivering measured data, especially digitized data;
a second connection system for a second measuring device delivering measured data, especially digitized data; as well as
at least a third connection system for the at least one data processing unit;
wherein the first connection system and at least the second connection system, especially each of the three connection systems, have, in each case, a transformer coil placed within the module housing and connected to the electronics module for forming an inductively coupling interface transmitting data, especially digital data, especially according to the Universal Asynchronous Receiver Transmitter protocol, as well as electrical energy, especially an interface transmitting data and energy simultaneously, especially an interface transmitting exclusively inductively, and
wherein each of the at least two transformer coils is, in each case, placed within a plug connector element (especially a plug connector element formed as an integral component of the module housing) serving to form a plug connector coupling, especially a releasable plug connector coupling, and composed, at least partially, especially predominantly or exclusively, of a plastic or other synthetic material, especially a plastic or other synthetic material which is at least partially electrically non-conductive.

Moreover, the invention resides in a measuring system for measuring at least one physical and/or at least one chemical, measured variable, wherein the measuring system comprises such a distributor module.

According to a first embodiment of the distributor module of the invention, it is provided that the electronics module includes a control unit, especially one formed by means of a microprocessor and/or a modifiable logic chip and/or an application specific integrated circuit, for controlling at least the first connection system and the second connection system and/or for processing control commands received via a third connection system. Developing this embodiment of the invention further, it is additionally provided that the electronics module has a selective switching circuit, especially one controlled by and/or integrated into the control unit, for the selective connection of the control unit to at least one of the transformer coils and/or for the selective connection of the third connection system to at least one of the transformer coils of the first or second connection system.

According to a second embodiment of the distributor module of the invention, it is provided that the electronics module includes at least a first demodulator for separating, especially by means of amplitude demodulation and/or by means of frequency demodulation, information concerning at least one physical, measured variable and/or the distributor module from an electrical carrier signal transmitted via an inductively coupling interface, wherein, for forming an inductively coupling interface transmitting, especially simultaneously, data as well as electrical energy, an input of the first demodulator is connected, at least at times, especially predominantly or permanently, to one, especially exactly one, of the transformer coils. Developing this embodiment of the invention further, it is additionally provided that the electronics module has at least a second demodulator for separating information concerning at least one physical, measured variable and/or the distributor module from an electrical carrier signal transmitted via an inductively coupling interface, wherein, for forming an inductively coupling interface transmitting, especially simultaneously, data as well as electrical energy, an input of the second demodulator is connected, at least at times, especially predominantly or permanently, to one, especially exactly one, of the transformer coils, especially the transformer coil of the third connection system. Developing this embodiment of the invention further, it is additionally provided that the electronics module has at least a third demodulator for separating information concerning at least one physical, measured variable and/or the distributor module from an electrical carrier signal transmitted via an inductively coupling interface. In such a case, for forming an inductively coupling, first interface for transmitting, especially simultaneously, data as well as electrical energy, an input of the first demodulator can be connected, at least at times, especially permanently, to the transformer coil of the first connection system; for forming an inductively coupling, second interface for transmitting, especially simultaneously, data as well as electrical energy, an input of the second demodulator can be connected, at least at times, especially permanently, to the transformer coil of the second connection system; and for forming an inductively coupling, third interface for transmitting, especially simultaneously, data as well as electrical energy, an input of the third demodulator can be connected, at least at times, especially permanently, to the transformer coil of the third connection system.

According to a third embodiment of the distributor module of the invention, it is provided that the electronics module has at least a first modulator for modulating, especially by means of amplitude modulation and/or frequency modulation, information concerning the at least one physical, measured variable and/or measuring devices onto an electrical carrier signal transmittable via an inductively coupling interface wherein, for forming an inductively coupling interface transmitting, especially simultaneously, data as well as electrical energy, an output of the first modulator is connected, at least at times, especially predominantly or permanently, to one, especially exactly one, of the transformer coils. Developing this embodiment of the invention further, it is additionally provided that the electronics module has at least a second modulator for modulating information concerning the at least one physical, measured variable and/or measuring devices onto an electrical carrier signal transmittable via an inductively coupling interface, wherein, for forming an inductively coupling interface transmitting, especially simultaneously, data as well as electrical energy, an output of the second modulator is connected, at least at times, to one of the transformer coils. Developing this embodiment of the invention further, it is additionally provided that the electronics module has at least a third modulator for modulating information concerning at least one physical, measured variable and/or the distributor module onto an electrical carrier signal transmittable via an inductively coupling interface. In such a case, for forming an inductively coupling, first interface for transmitting, especially simultaneously, data as well as electrical energy, an output of the first modulator can be connected, at least at times, especially permanently, to the transformer coil of the first connection system; for forming an inductively coupling, second interface for transmitting, especially simultaneously, data as well as electrical energy, an output of the second modulator can be connected, at least at times, especially permanently, to the transformer coil of the second connection system; and for forming an inductively coupling, third interface for transmitting, especially simultaneously, data as well as electrical energy, an output of the third modulator can be connected, at least at times, especially permanently, to the transformer coil of the third connection system According to a fourth embodiment of the distributor module the invention, it is provided that the electronics module has at least a first modem, operated especially in semi-duplex or full-duplex mode, for separating, especially by means of amplitude demodulation and/or by means of frequency demodulation, information relevant to the at least one physical, measured variable from an electrical carrier signal transmitted via an inductively coupling interface and for modulating, especially by means of amplitude modulation and/or by means of frequency modulation, information concerning the at least one physical, measured variable and/or measuring devices onto an electrical carrier signal to be transmitted via an inductively coupling interface, wherein, for forming an inductively coupling interface transmitting, especially simultaneously, data as well as electrical energy, a first input of the first modem is connected, at least at times, with one of the transformer coils and a first output of the first modem is connected, at least at times, with said transformer coil. Developing this embodiment of the invention further, it is additionally provided that the electronics module has at least a second modem for separating, especially by means of amplitude demodulation and/or by means of frequency demodulation, information relevant to the at least one physical, measured variable from an electrical carrier signal transmitted via an inductively coupling interface and for modulating, especially by means of amplitude modulation and/or by means of frequency modulation, information concerning the at least one physical, measured variable and/or measuring devices onto an electrical carrier signal to be transmitted via an inductively coupling interface; wherein, for forming an inductively coupling interface transmitting, especially simultaneously, data as well as electrical energy, a first input of the second modem is connected, at least at times, to one of the transformer coils and a first output of the second modem is connected, at least at times, with said transformer coil. Developing this embodiment of the invention further, it is additionally provided that the electronics module has at least a third modem for separating, especially by means of amplitude demodulation and/or frequency demodulation, information concerning the at least one physical, measured variable from an electrical carrier signal transmitted via an inductively coupling interface and for modulating, especially by means of amplitude modulation and/or frequency modulation, information concerning the at least one physical, measured variable and/or measuring devices onto an electrical carrier signal to be transmitted via an inductively coupling interface; wherein, for forming an inductively coupling interface transmitting, especially simultaneously, data as well as electrical energy, a first input of the third modem is connected, at least at times, to one of the transformer coils and a first output of the third modem is connected, at least at times, to said transformer coil. In such a case, a second input of the third modem is coupled at least at times, especially permanently, to an output of the control unit; and/or a second output of the third modem is coupled at least at times, especially permanently, to an input of the control unit.

According to a fifth embodiment of the distributor module of the invention, it is provided that the electronics module has an internal supply circuit coupled at least at times, especially permanently, with at least one of the transformer coils, especially an internal supply circuit having a capacitive and/or inductive and/or electrochemical, energy storer for providing electrical energy transmittable via an inductively coupling interface. Developing this embodiment of the invention further, it is additionally provided that the internal supply circuit provides electrical energy transmittable via an inductively coupling interface by means of an alternating electrical current, especially, a sinusoidal or rectangular, alternating electrical current, driven via an alternating voltage, especially an impressed, alternating voltage and/or an alternating voltage held at a predetermined voltage level. The alternating voltage and/or the alternating electrical current can serve, in such case, for forming a carrier signal for information transmittable via an inductively coupling interface. In another further development of the fifth embodiment of the distributor module of the invention, it is additionally provided that the internal supply circuit is connected during operation simultaneously, especially permanently, to transformer coils of at least two connection systems; and/or that the internal supply circuit has at least one rectifier, which is electrically connected, at least at times, to at least one of the transformer coils via a primary side voltage connection for alternating voltage; and/or that the internal supply circuit (NRG) has at least one inverter, which is electrically connected, at least at times, to at least one of the transformer coils via a secondary side voltage connection for alternating voltage; and/or that the internal supply circuit has at least one electrical current converter which is electrically connected, at least at times, to at least one of the transformer coils via a voltage connection for alternating voltage; and/or that the internal supply circuit has at least one frequency converter, which is electrically connected, at least at times, to at least one of the transformer coils, especially the transformer coil of the first connection system, via a first voltage connection for alternating voltage and which is electrically connected, at least at times, to at least one of the transformer coils, especially the transformer coil of the third connection system, via a second voltage connection for alternating voltage.

According to a sixth embodiment of the distributor module of the invention, it is provided that such further comprises:

At least one connection system, especially a connection system constructed equally to the first connection system, for an external service module, especially a service and/or diagnostic unit; and/or at least one connection system, especially a connection system constructed equally to the first connection system, for an external data memory, especially an EEPROM and/or a hard disk, for storing measured variables and/or information concerning the distributor module or measuring devices connected thereto; and/or further connection systems, especially connection systems constructed equally to the first connection system, for each measuring device delivering measured data.

According to a seventh embodiment of the distributor module of the invention, it is provided that the module housing is embodied explosion protectedly and/or pressure resistantly, especially in a manner sufficient to meet the requirements of the ignition protection type "Pressure-Resistant Encapsulation" (Ex-d); and/or that the electronics module is embodied explosion protectedly, especially in a manner sufficient to meet the requirements of the ignition protection type "Intrinsic Safety" (Ex-i) and/or the requirements of the ignition protection type "Increased Safety" (Ex-e).

According to a first embodiment of the measuring system of the invention, it is provided that such further comprises:

a first measuring device delivering, especially by means of an alternating electrical current modulated as regards amplitude and/or frequency and/or by means of an alternating voltage modulated as regards amplitude and/or frequency, at least at times, information, especially in the form of a telegram according to a Universal Asynchronous Receiver Transmitter protocol, concerning at least one physical, measured variable of a first type and having a connection system for the distributor module or for a connecting cable serving for connecting of measuring device and distributor module, especially a cable corresponding to one of the standard interfaces EIA-485, EIA-232 or EIA-422;

at least a second measuring device delivering, especially by means of an alternating electrical current modulated as regards amplitude and/or frequency and/or by means of an alternating voltage modulated as regards amplitude and/or frequency, at least at times, information, especially in the form of a telegram according to a Universal Asynchronous Receiver Transmitter protocol, concerning the measured variable of first type and/or a physical, measured variable of second type and having a connection system for the distributor module or for a connecting cable serving for connecting of measuring device and distributor module, especially a cable corresponding to one of the standard interfaces EIA-485, EIA-232 or EIA-422; as well as an electronic data processing unit, especially an electronic data processing unit remote from the distributor module and/or connected to a fieldbus, wherein the electronic data processing unit is coupled electrically, with interpositioning of the distributor module, at least at times, with the first measuring device and/or with the second measuring device.

Further developing this embodiment of the measuring system of the invention, it is additionally provided that at least one of the measuring devices, especially each of the two measuring devices, is supplied with electrical energy at least partially by the distributor module; and/or that at least one, especially each of the at least two measuring devices, in each case, draws electrical power converted therein at least partially from the distributor module via the connection system of the distributor module connected to said measuring device; and/or that the first measuring device is connected to the distributor module via a first connection system, especially by interposing a connecting cable; and/or that the second measuring device is connected to the distributor module via a second connection system, especially by interposing a connecting cable.

According to a second embodiment of the measuring system of the invention, it is provided that the connection system of at least one, especially each, of the at least two measuring devices includes, in each case, a transformer coil for forming an interface, which serves for transmitting, especially simultaneously, data, especially by means of the Universal Asynchronous Receiver Transmitter protocol or ETHERNET, as well as electrical energy, by inductive coupling, especially exclusively by inductive coupling, especially while also holding the at least one measuring device galvanically isolated from the distributor module. Developing this embodiment of the measuring system of the invention further, it is additionally provided that the transformer coil of at least one, especially each, of the at least two measuring devices is placed within a plug connector element made at least partially, especially predominantly or exclusively, from a plastic or other synthetic material, especially an electrically non conductive material, for forming a plug connector coupling, especially a releasable plug connector coupling, wherein the plug connector element is embodied complementarily to at least one of the plug connector elements of the distributor module; and/or that the transformer coil of at least one, especially each, of the at least two measuring devices forms, together with the, in each case, corresponding transformer coil of the distributor module connection system connected to the particular measuring device, a transformer, especially a transformer implementing the single electrical connection between said measuring device and the distributor module.

According to a third embodiment of the measuring system of the invention, it is provided that the first measuring device is connected to the first connection system to form a first interface, which serves for transmitting, especially simultaneously, data, especially by means of the Universal Asynchronous Receiver Transmitter protocol, as well as electrical energy, by inductive coupling, especially exclusively by inductive coupling, especially while also holding the first measuring device galvanically isolated from the distributor module, especially also while forming a releasable plug connector coupling. Further developing this embodiment of the measuring system of the invention, it is additionally provided that the second measuring device is connected to the second connection system to form a second interface, which serves for transmitting, especially simultaneously, data, especially by means of the Universal Asynchronous Receiver Transmitter protocol, as well as electrical energy, by inductive coupling, especially exclusively by inductive coupling, especially while also holding the second measuring device galvanically isolated from the distributor module, especially also while forming a releasable plug connector coupling.

According to a fourth embodiment of the measuring system of the invention, it is provided that at least one of the measuring devices is a pH-measuring device, which recurringly registers a pH value of a liquid; and/or that at least one of the measuring devices is a conductivity measuring device, which recurringly registers an electrical conductivity of a liquid; and/or that at least one the measuring devices is a pressure measuring device, which recurringly registers a pressure of a fluid.

According to a fifth embodiment of the measuring system of the invention, it is provided that at least one of the measuring devices comprises a potentiometric sensor, an amperometric sensor, a photometric sensor, a spectrometric sensor, a temperature sensor, a pressure sensor, a flow sensor or a conductivity sensor.

According to a sixth embodiment of the measuring system of the invention, it is provided that such further comprises a fieldbus, especially a FOUNDATION FIELDBUS or PROFIBUS fieldbus, on which the electronic data processing unit sends, at least at times, a measured value and/or a current operating state of the distributor module and/or a parameter value signaling one of the measuring devices connected thereto.

According to a seventh embodiment of the measuring system of the invention, it is provided that the distributor module is supplied at least partially with electrical energy by the electronic data processing unit; and/or that the distributor module draws electrical power converted therein at least partially from the electronic data processing unit; and/or that the electronic data processing unit is connected to the distributor module via a third connection system, especially by interposing a connecting cable.

A basic idea of the invention is, among other things, to improve measuring systems by means of the distributor module of the invention toward the goal that, in the case of operationally related replacement of measuring devices on-site, an interruption free measuring operation is enabled, while maintaining the high process safety of inductively coupling interfaces of the type discussed above. Additionally, a further advantage of the invention is also to be seen in the fact that by means of the connection system of the distributor module, standard interfaces can be provided, which are, in given cases, also adaptable during operation and insofar universal, and which also enable the implementing of diverse measuring systems. thus measuring systems formed with measuring devices using different measurement principles, or, however, spatially distributed measuring systems with comparatively little wiring effort. The connecting of such a modular, in given cases, also energetically autarkic, measuring system to superordinated data processing systems can be performed, in such a case, in advantageous manner by applying plug connector systems already established in industrial measurements technology, formed from plug connector elements complementary to one another, especially also plug connector elements lacking contacts, for instance, according to the above mentioned U.S. Pat. No. 6,705,898 or 6,476,520. Furthermore, repeater and/or switch, or hub, functionalities can be provided for industrial measurements technology by means of the distributor module of the invention.

The invention as well as other advantageous embodiments thereof will now be explained in greater detail based on examples of embodiments presented in the figures of the drawing. Equal parts are provided with equal reference characters in all figures; in the interest of perspicuity, previously mentioned reference characters are omitted in subsequent figures. Other advantageous embodiments or further development will become evident additionally from the dependent claims, as well as also from the figures of the drawing per se. The figures of the drawing show as follows:

Figure 1:
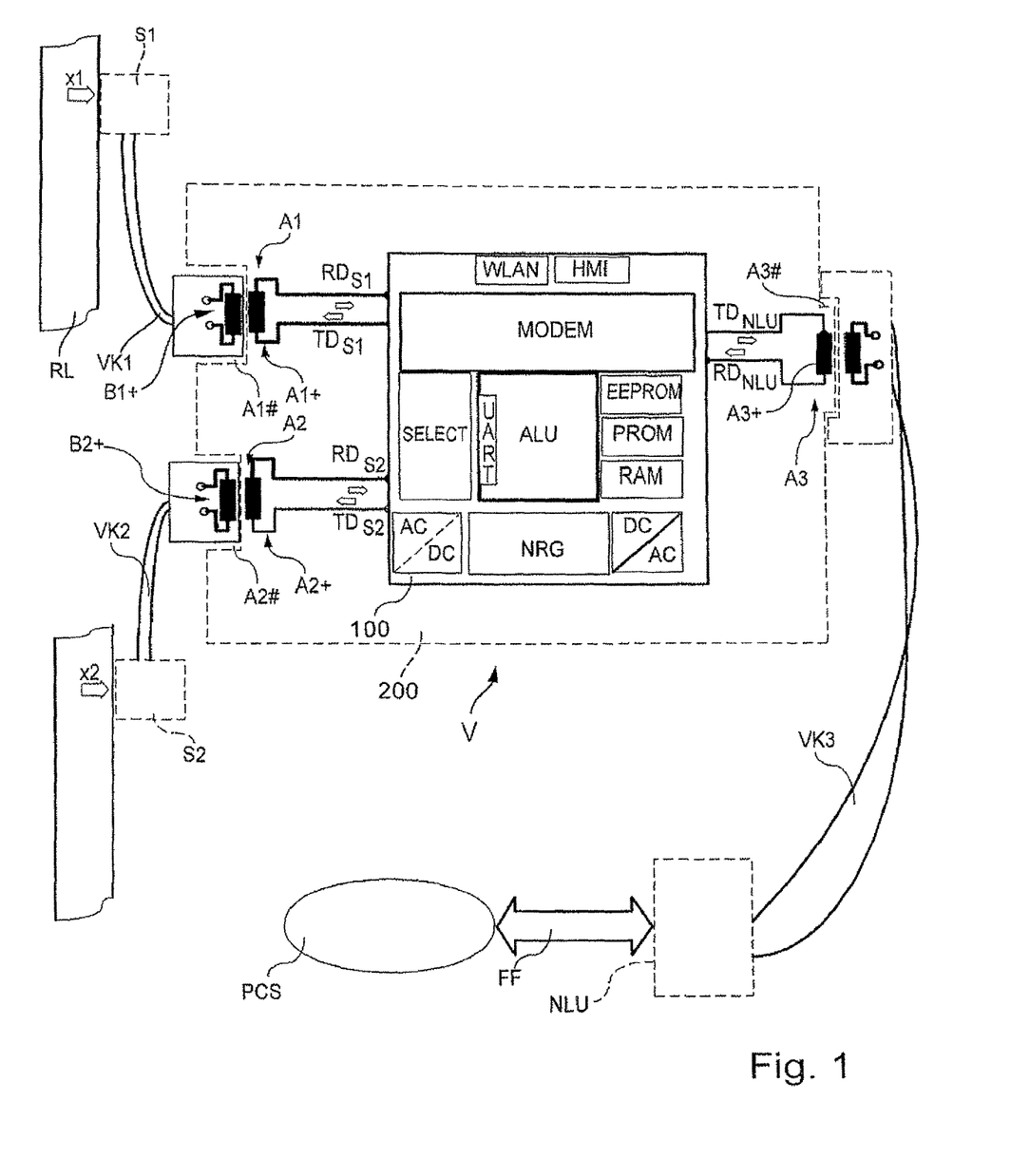
FIG. 1 schematically, of a measuring system including a measuring device connected to a distributor module as well as a data processing unit connected to such distributor module.
Figure 2:
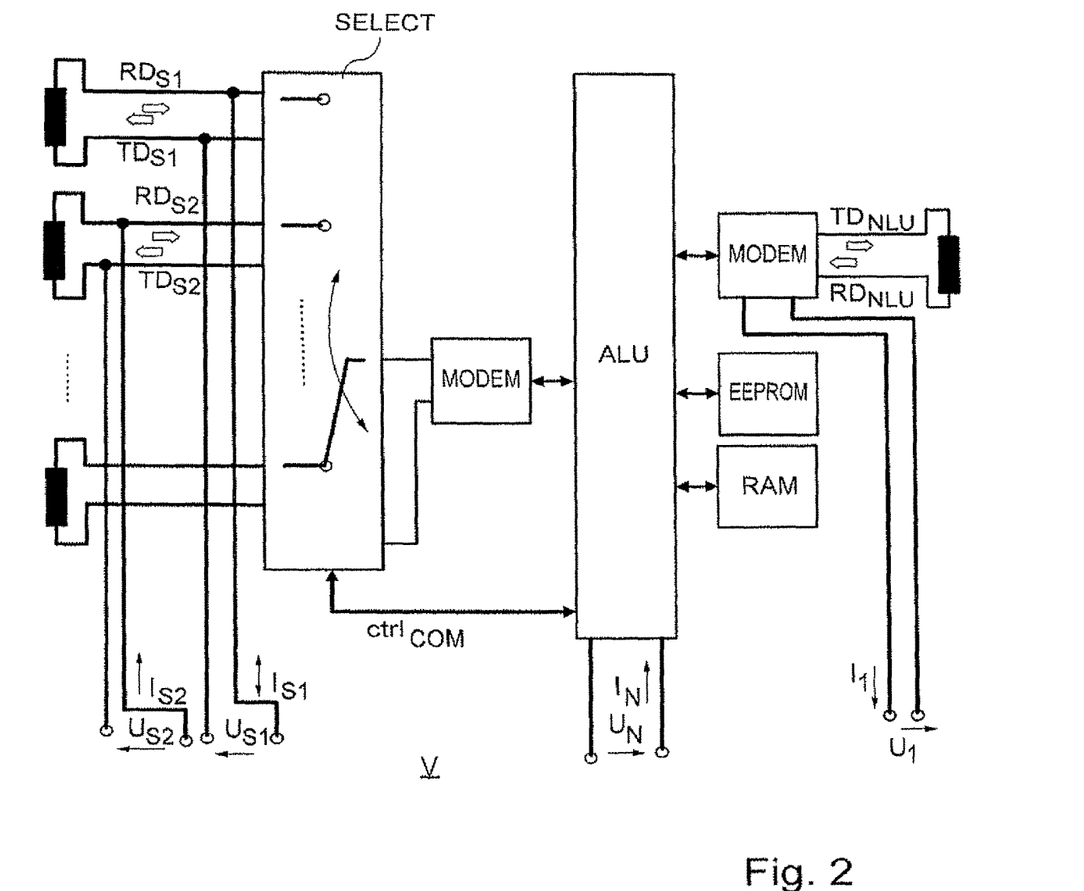
FIGS. 2 to 5 embodiments of a distributor module suitable for a measuring system according to FIG. 1.

FIG. 1 shows a measuring system for registering and forwarding measured values. The measuring system comprises a first measuring device S1 delivering, at least at times, information, coded in digitized measured data, for example, concerning at least one physical, measured variable x1 of first type, especially serving for influencing and/or monitoring a process parameter of an industrial and/or automated process to be monitored, as well as at least a second measuring device S2 delivering, at least at times, information concerning the physical, measured variable x1 of first type and/or information, coded in digitized measured data, for example, concerning at least a physical, measured variable x2 of second type. For the latter case, the physical, measured variable x1 of first type can differ from the physical, measured variable x2 of second type, for example, as regards the location of the registering sensors and/or as regards their dimensions. For example, serving as measuring devices S1, S2 can be a pH measuring device recurringly registering a pH value of a liquid, a conductivity measuring device recurringly registering an electrical conductivity of a liquid, or a pressure measuring device recurringly registering a pressure of a fluid. Correspondingly, at least one of the measuring devices S1, S2 can be equipped with a potentiometric sensor, an amperometric sensor, a photometric sensor, a spectrometric sensor, a pressure sensor, or a conductivity sensor, while, of course, other measuring device types, and thus also other measuring transducer types, can also serve for implementing the measuring system, such as, for instance, also a flow measuring flow measuring device or sensors, or also temperature measuring devices or sensors. Furthermore, the particular measuring device S1, S2 can include, as is quite usual in such measuring systems, a microprocessor 7, as well as an analog-digital converter connected thereto for digitizing an analog primary signal corresponding to the registered measured variable and generated by the measuring transducer. The particular measuring device S1, S2 additionally comprises digital data memory, in which sensor data or process data can be stored. For example, calibration data for the respective measuring transducer can also be stored in the digital data memory. With the help of the calibration data, the digitized measured data delivered by the measuring transducer can be converted to corresponding physical, measured values, also, in given cases, externally of the respective measuring device. The calibration values ascertained for the measuring transducer can be stored within the respective measuring device, thus enabling a fixed association of the calibration data with the measuring transducer. Since each measuring device S1, S2 bears its own calibration data within itself, confusion between different sets of calibration data can be prevented.

Additionally, the measuring system comprises a distributor module V connected to at least two measuring devices S1, S2 as well as an electronic data processing unit NLU, especially one remote from the distributor module and/or connected to a fieldbus. The electronic data processing unit NLU is, at least at times, electrically coupled through the distributor module to the first measuring device S1 and/or to the second measuring device S2. Consequently, each of the at least two measuring devices includes a connection system for the distributor module or for a connecting cable CC1, CC2, for example, a connecting cable corresponding to one of the standard interfaces EIA-485, EIA-232 or EIA-422 mentioned above, serving to connect measuring device and distributor module. The respective measuring device sends its measured data $RD_{S1}$, $RD_{S2}$ via the connection system to the connected distributor module V, for example, in the form of an alternating electrical current modulated as regards amplitude and/or frequency and/or by means of a alternating voltage modulated as regards amplitude and/or frequency, or in the form of a telegram according to a UART (Universal Asynchronous Receiver Transmitter) protocol. The distributor module in turn transmits the measured data further to data processing unit NLU via connecting cable CC3 connected to the distributor module. The data processing unit NLU is embodied, for example, in the form of a measurement transmitter converting raw data to measured values. The electronic data processing unit NLU can be coupled, as presented in FIG. 1, additionally to a fieldbus of the measuring system formed, for example, as FOUNDATION FIELDBUS or PROFIBUS fieldbus, on which the data processing unit transmits information $TD_{NLU}$ transmitted from the distributor module, information such as forwarded or conditioned measured data of the connected measuring devices and/or a current operating state of the distributor module and/or parameter values signaling one of the measuring devices connected thereto, or measured values produced by the data processing unit from the received measured data.

The distributor module V especially serves for distributing electrical power to the at least two connected measuring devices S1, S2 as well as for forwarding to the at least one superordinated electronic data processing unit NLU information concerning the at least one physical, measured variable, sent on the part of the at least two connected measuring devices. Especially, the data processing unit NLU serves also for processing data corresponding to the measured variable and/or for controlling the distributor module. As presented schematically in FIG. 1, the distributor module comprises a module housing 200 (especially a module housing 200 embodied to be water spray and/or explosion and/or pressure resistant), as well as an electronics module 100 (especially an explosion protected, electronics module 100) placed within the module housing 200. Depending on the type of application selected, it can additionally be required to construct the module housing to be explosion protected and/or pressure resistant in a manner sufficient for the requirements according to the ignition protection type "Pressure-Resistant Encapsulation" (Ex-d) and/or to execute the electronics module to be explosion protected in a manner sufficient for the requirements according to the ignition protection type "Intrinsic Safety" (Ex-i) and/or the requirements according to the ignition protection type "Increased Safety" (Ex-e).

Furthermore, the distributor module includes a first connection system A1 for the first measuring device S1 delivering, for example, digitized measured data; a second connection system A2 for the second measuring device S2, delivering, for example, digitized measured data, as well as at least a third connection system A3 for the data processing unit NLU. Additionally, it can be quite an advantage, to provide other, especially connection systems constructed equally to the first connection system for the distributor module, for example, in each case, for an additional measuring device delivering measured data and/or for an external service module, especially an operating and/or diagnostic unit and/or for an external data memory, especially an EEPROM and/or a hard disk for saving measured variables and/or relevant information from the distributor module or measuring devices connected thereto.

For controlling the distributor module, especially also the first connection system and the second connection system and/or for processing control commands received via a third connection system, the electronics module according to an embodiment of the invention, as well as also schematically presented in FIGS. 1, 2, 3, 4, and 5, in each case, includes a control unit ALU, formed for example, by means of a microprocessor (µC) and/or a modifiable logic chip (FPGA) and/or an application specific integrated circuit (ASIC).

Additionally, it can be quite advantageous further to provide the distributor module with a display system HMI communicating with the control unit, e.g. formed by means of a plurality of LEDs and/or a display, for visualizing data transmitted via the distributor module and/or for visualizing status information concerning the distributor module, e.g. also instantaneous terminal assignments for connection systems of the distributor module and/or data streams flowing via the connection system; and/or a servicing system HMI communicating with the control unit, especially formed by means of individual keys and/or a touch display, for programming the control unit and/or for the selective turning on or off of connection systems of the distributor module; and/or a radio system WLAN communicating with the control unit for wireless sending and/or receiving of configuration data for the distributor module.

Furthermore, it is also possible to equip the electronics module with a non-permanent, especially persistent data memory, especially an EEPROM and/or a hard disk, communicating with the control unit and/or integrated therein for the storing of measured variables and/or relevant information from the distributor module or measuring devices connected thereto; for example, for the storing of measured values generated by a measuring device connected to the distributor module, in given cases also measured values marked with a time stamp representing the point in time of the generating; and/or for the storing of data identified for the distributor module by a connected measuring device; and/or for the storing of data, especially sensor type identification, authenticating a connected measuring device in relation to the distributor module; and/or calibration data specifying the sensor module; and/or certificates filled out for the measuring device; and/or operating approval granted to the measuring device; and/or an enabling code serving for the activation of the measuring device, and/or with at least one especially permanent data memory PROM, for example, for the storing of data identifying the distributor module for a connected measuring device; and/or data authenticating the distributor module in relation to the measuring device; and/or for the storing data serving for a parameterization of a connected measuring device; and/or for the storing of certificates filled out for the distributor module; and/or for operating approval granted to the distributor module, and/or for the storing of an enabling code serving for the activation of the measuring device.

At least the two connection systems A1, A2, especially ones constructed equally to one another, provided for the measuring devices additionally have, in the case of the distributor module V of the invention, in each case, a transformer coil A1+, A2+ placed within the module housing, connected to the electronics module for forming an especially digital, inductively coupling interface transmitting data especially according to the Universal Asynchronous Receiver Transmitter protocol (UART) as well as electrical energy, in given cases also simultaneously, between the respective measuring device and the distributor module. In such a case, each of the at least two transformer coils A1+, A2+ of the distributor module is placed, in each case, within an plug connector element A1#, A2# at least partially, especially predominantly or exclusively, of a plastic or other synthetic material, especially an electrically non conductive material, serving to form a plug connector coupling, especially a releasable coupling, formed especially as an integral component of the module housing. Additionally, the third connection system provided for the data processing unit NLU includes, as presented schematically in FIG. 1, a transformer coil A3+ placed within a plug connector element A3# made at least partially, especially predominantly or exclusively, of a plastic or other synthetic material, especially an electrically non-conductive material, serving for the formation of a plug connector coupling, especially a releasable coupling, especially formed as an integral component of the module housing. For the case shown here, in which the so formed interface has an exclusively inductively coupling nature, a galvanic isolation of the measuring device from the distributor module and in given cases, also of the distributor module from the data processing unit can be achieved in a very simple manner. Furthermore, an interface impervious to liquids can be implemented in a simple manner, in which no exposed contact elements for the manufacture of electrical connections between the measuring device and distributor module are required.

The respective measuring device is connected by means of the plug connector element—here provided by the respective connecting cable CC1 or CC2—by the plugging in of the same to the complementary plug connector element of the distributor module V. In such a case, the transformer coil of the relevant connection system and the associated transformer coil of the measuring device or its connecting cable are placed in a defined spatial position relative to one another, so that high frequency carrier signals, also bi directional signals in given cases, can be transmitted between the distributor module V and each connected measuring device. In this way, data exchange between the distributor module and the measuring device is enabled. Moreover, the energy supply of the respective measuring device can also occur via the inductive interface. Conversely, the distributor module V can draw the required energy from the connected data processing unit.

Figure 6:
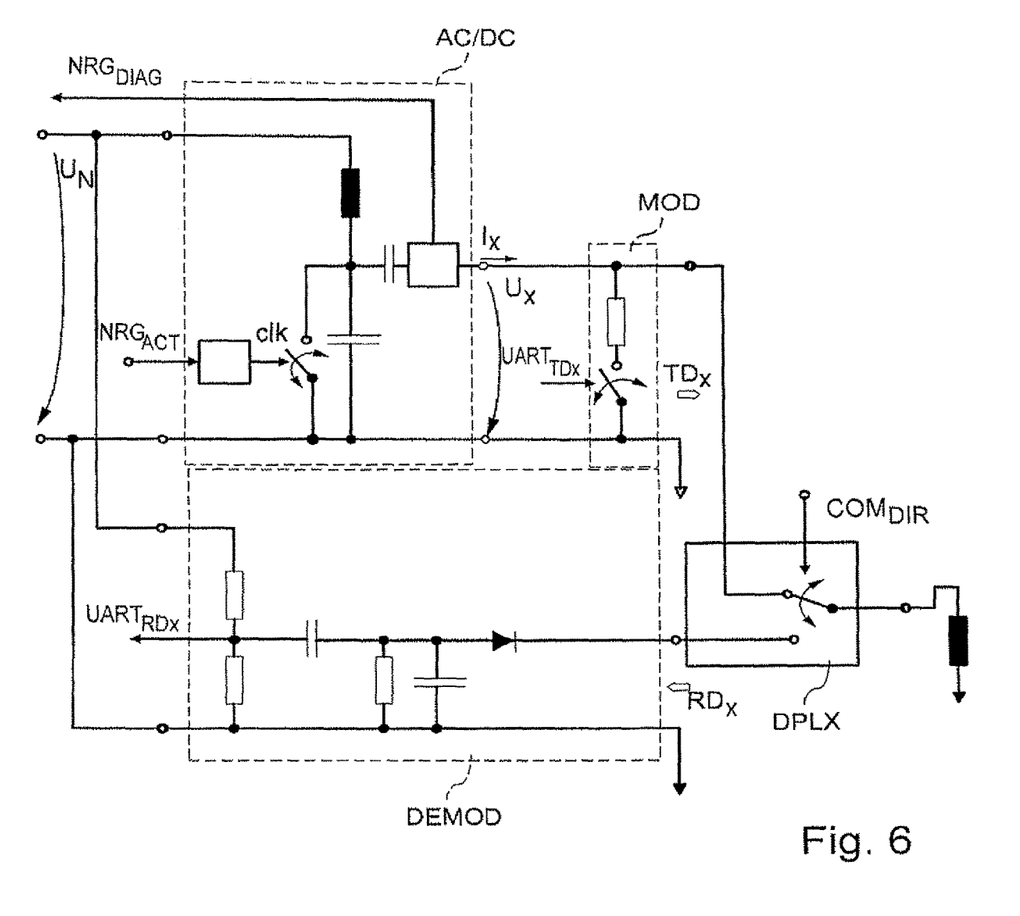
FIG. 6 a modem circuit (including rectifier) suitable for application in such a distributor module.

For separating information $RD_{S1}$, $RD_{S2}$, or $RD_{NLU}$ concerning at least one physical, measured variable and/or the distributor module from an electrical carrier signal transmitted via inductively coupling interface, the electronics module includes at least one demodulator DEMOD (correspondingly adapted to the modulation method actually applied for the received data), of which, for the purpose of forming the inductively coupling interface transmitting, especially simultaneously, data as well as electrical energy, one input is connected, at least at times, especially predominantly or permanently, with, especially exactly, one of the transformer coils. A possible embodiment of a demodulator (here only passively implementing an amplitude demodulation of an input supplied, carrier signal carrying information $RD_x$ ($RD_{S1}$, $RD_{S2}$, . . . , $RD_{NLU}$)) is schematically shown in FIG. 6. Instead a demodulator implementing amplitude demodulation can, in case required, of course, be applied, as well as also a demodulator implementing another demodulation method, for example, a frequency demodulation.

Additionally, the electronics module includes at least one modulator MOD for modulating information $TD_{S1}$, $TD_{S2}$, or $TD_{NLU}$ concerning the at least one physical, measured variable and/or measuring devices onto an electrical carrier signal transmittable via inductively coupling interface, for example, by means of amplitude modulation (AM, ASK) and/or by means of frequency modulation (FM, FSK). For the purpose of forming the inductively coupling interface transmitting, especially simultaneously, data as well as electrical energy, an output of the modulator is connected, at least at times, especially predominantly or permanently, with, especially exactly, one of the transformer coils. A possible embodiment of a modulator (here implementing an amplitude demodulation of an input supplied, carrier signal carrying information $TD_x$ ($TD_{S1}$, $TD_{S2}$, . . . , $TD_{NLU}$)) is schematically shown in FIG. 6. Instead of such a modulator implementing an amplitude modulation, for example, according to an amplitude shift keying (ASK), in case required, of course, also a modulator implementing another modulation method, for example, a frequency modulation according to a frequency shift keying method (FSK), can be applied.

Although modulator and demodulator can be embodied directly as separate assemblies, it is additionally, however, also directly possible to implement these two functions, as well as also shown in FIGS. 2, 3, 4 and 5, by means of a modem MODEM, operated e.g. in semi-duplex or full-duplex mode, thus, especially a modem with integrated duplexer DPLX. For forming a data as well as electrical energy transmitting (especially simultaneously), inductively coupling interface, then an input of the modem is, at least at times, connected with one of the transformer coils and an output of the modem, at least at times, with the same transformer coil.

Communication between the data processing unit NLU, the distributor module V and the respective measuring device can occur in semi-duplex operation, such as e.g. according to EIA-485, especially in the case of application of serial, data interfaces. This means that information is transmitted either in the form of data $RD_{NLU}$ from the data processing unit NLU via the distributor module V and in the form of data $TD_{S1}$, $TD_{S2}$ to the respective measuring device or, however, in reverse direction, in the form of data $RD_{S1}$, or $RD_{S2}$ from a measuring device via the distributor module V and in the form of data $TD_{NLU}$ to the data processing unit NLU. The particular transmission direction can, as shown e.g. in FIG. 6, be specified by a direction signal $COM_{DIR}$, which is produced, for example, by the control unit provided in the distributor module V and correspondingly fed to the duplexer DPLX.

Figure 4:
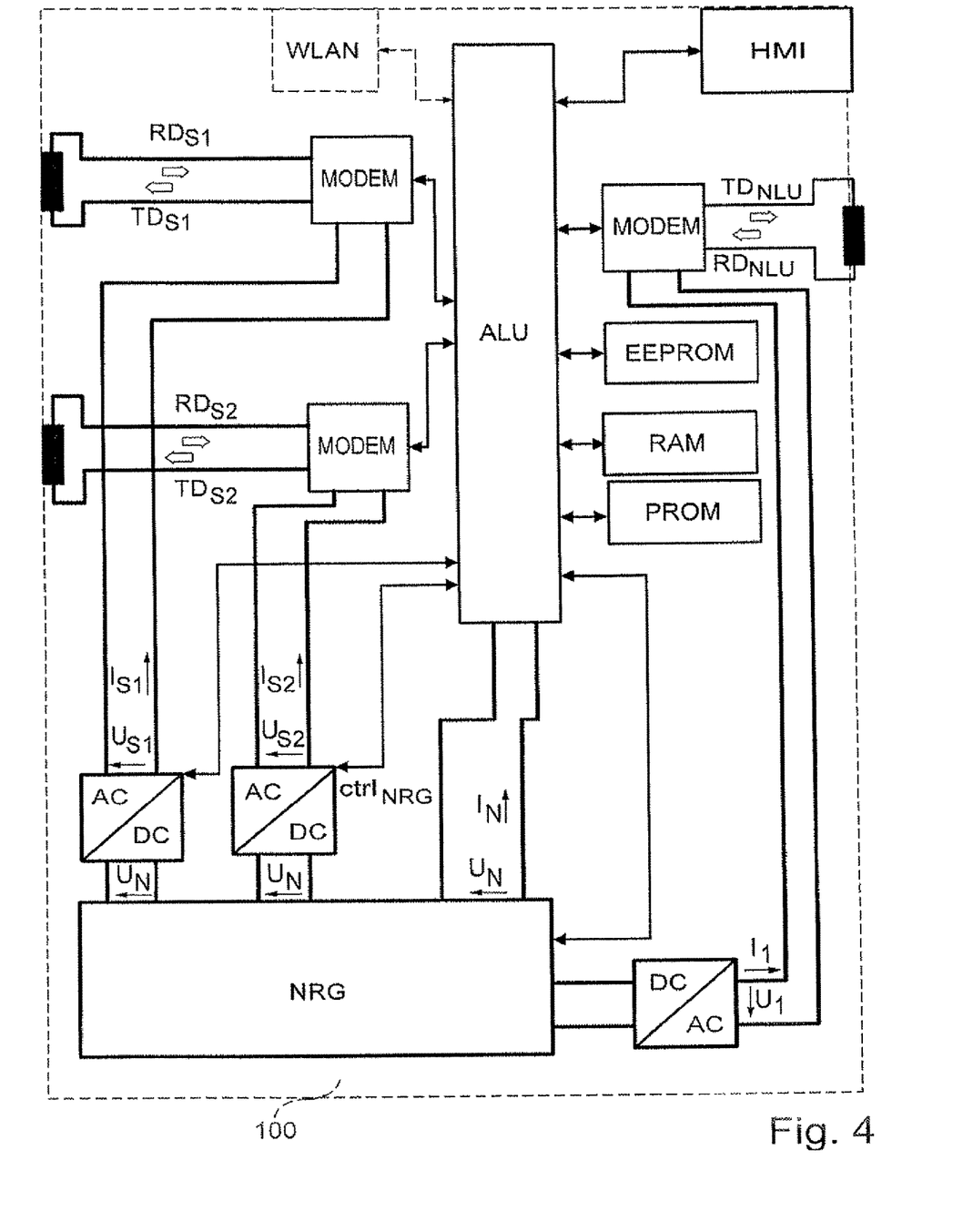
Figure 5:
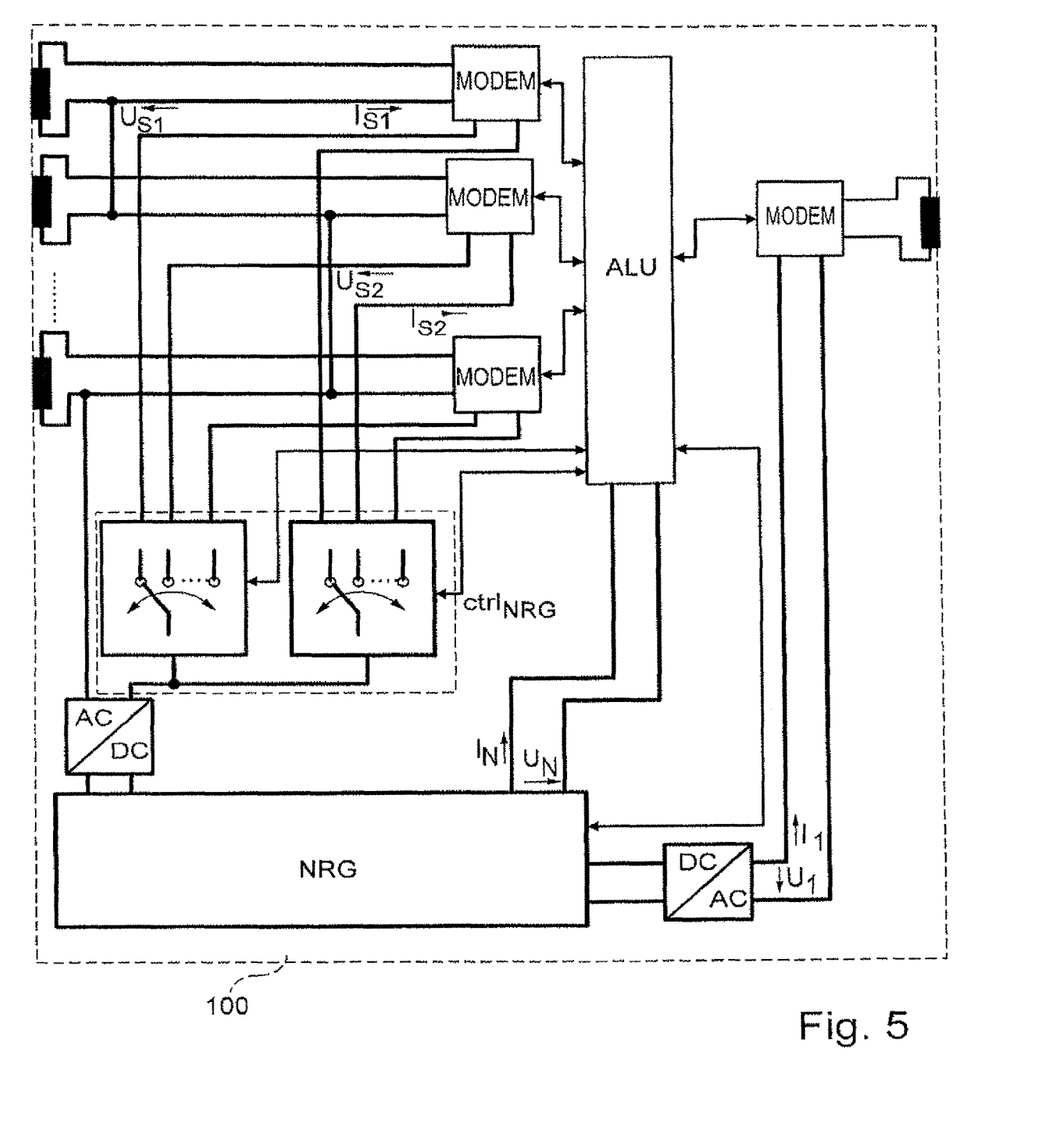

Especially in the case of application only of a single modem for the targeted, in given cases, bi-directional, transmission of information between the data processing unit and the at least two measuring devices, a correspondingly matched control of the actually present, numerous signal paths, or of a selective read-out of measured data received via connection system, or of a selective marking of data to transmit via connection system is required. Accordingly, the electronics module in an additional embodiment includes a selective switching circuit SELECT, for example, one controlled by the control unit ALU and/or integrated into such, for the selective connecting of the control unit to at least one of the transformer coils, for example, according to the variant of the distributor module shown in FIG. 2, and/or for the selective connecting of the third connection system to at least one of the transformer coils of the first, or second, connection system, for example, according to the variant of the distributor module shown in FIG. 3. Additionally, it is, however, directly also possible, as shown in FIG. 4 or 5, to assign each of the connection systems A1, A2, A3 its own modem or, however, also by means of individual addressing inserted into the data telegrams, directly to access, or to query, from the data processing unit, all connected measuring devices via a single modem of the distributor module. Depending on application of the selective switching circuit SELECT within the signal path formed by means of the distributor module, this can function as a multiplexer switching a number of its inputs sequentially to one output or as a demultiplexer switching one input sequentially to a number of outputs.

Figure 3:
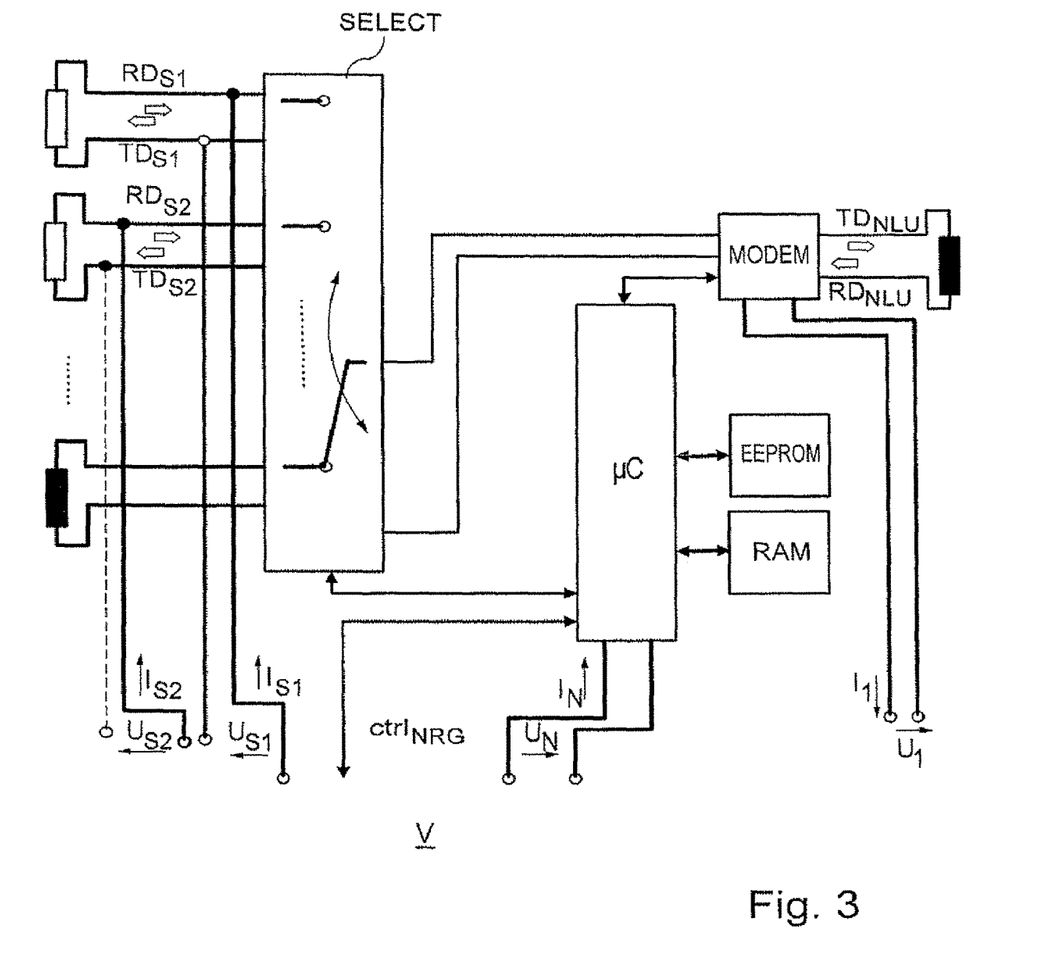

In the case of the examples of embodiments shown in FIG. 3, the control unit ALU of the distributor module 3 is practically itegrated into the signal path extending between data processing unit NLU and the, in each case, addressed measuring device. The modem, or the demodulator, receives accordingly the carrier signal lying on the respective connection system with the correspondingly on-modulated information. The information separated by demodulation and thereafter coded in a UART-capable, digital data signal is fed to a corresponding UART-port of the control unit ALU. This forwards the so won information, for example, in turn, by means of an UART-capable digital data signal, correspondingly to the modulator, which is instantaneously connected with the connection system connected to the data processing unit. Insofar, the distributor module inserted in the signal path acts practically as a signal regenerator, which transmits a newly reconditioned digital signal received at the input. Therefore, the distributor module can serve in this case practically as a repeater for measured data delivered by the measuring devices, or also for the data sent by the data processing unit to an, in each case, addressed measuring device, in which case noise as well as distortions are removed from the received digital signal and the digital signal is, thus, reconditioned as regards clocking and edge steepness. A worsening of the signal quality along the transmission path can, thus, be counteracted by means of distributor module and possible defects in the signal quality as a result of external disturbances or also as a result of attenuation brought about by the connecting cable-, or travel time effects, as, for instance, deteriorated edges, defective clocking and/or increased signal noise, can, thus, be compensated. Thus, data processing unit, and, respectively, the measuring devices received data signals of high signal quality, whereby the frequency of transmission errors can be reduced.

For providing electrical power required for operation of the distributor module and, in given cases, also connected measuring devices, the electronics module includes, additionally, an internal supply circuit NRG coupled, at least at times, in given cases, also permanently, to at least one of the transformer coils. Supply circuit NRG can include, for example, also capacitive and/or inductive and/or electrochemical, energy storers. Supply circuit NRG provides electrical energy transmittable via inductively coupling interface and/or drawn via inductively coupling interface, for example, electrical energy in the form of an alternating current, especially a sinusoidal or rectangular, alternating current, driven by an alternating voltage, especially an impressed alternating voltage and or an alternating voltage held at a predetermined voltage level. The alternating voltage and/or the alternating electrical current can serve for forming a carrier signal for information transmittable via inductively coupling interface. The information is correspondingly modulated by means of the at least one modulator MOD, or by the modem. The internal supply circuit NRG can be connected, for example, permanently or, however, also via electronic switching network, only at times to the transformer coils; in latter case, principally, however, in such a manner, that the supply circuit is connected during operation simultaneously to transformer coils of at least two connection systems. Furthermore, it can be necessary to provide in the supply circuit the current limiter and/or voltage limiter for limiting maximum electrical power issuable from its, in given cases, present, energy storer.

For obtaining, or providing, via connection system, incoming, and outgoing, usable electrical energy, moreover, converter known to those skilled in the art can be used, such as, for instance, rectifiers AC/DC electrically connected with a primary side voltage connection for alternating voltage, at least at times, to at least one of the transformer coils, inverters DC/AC electrically connected with a secondary side voltage connection for alternating voltage, at least at times, to at least one of the transformer coils, electrical current converters electrically connected with a voltage connection for alternating voltage, at least at times, to at least one of the transformer coils, or frequency converters electrically connected with a first voltage connection for alternating voltage, at least at times, to at least one of the transformer coils, especially the transformer coil of the first connection system, and with a second voltage connection for alternating voltage electrically connected, at least at times, to at least one of the transformer coils, especially the transformer coil of the third connection system. In the latter case, for example, a frequency converter can be used, which is electrically connected with a primary side first voltage connection for alternating voltage, at least at times, to the transformer coil of the third connection system and with a secondary side second voltage connection for alternating voltage, at least at times, especially in the case of connected first voltage connection for alternating voltage to the transformer coil of the third connection system, to the transformer coil of the first connection system, and which, during operation, by means of a primary side alternating voltage applied to its first voltage connection, delivers a secondary side alternating voltage of predeterminable frequency and/or predeterminable amplitude applied to its second voltage connection, especially in such a manner, that the frequency of the secondary side alternating voltage equals a frequency of the primary side alternating voltage and/or that the amplitude of the secondary side alternating voltage equals an amplitude of the primary side alternating voltage. The internal supplying of the distributor module with electrical power can then occur directly by means of the output of the mentioned rectifier AC/DC, or by means of the direct voltage UN present in the intermediate circuit of the frequency converter, or a direct voltage UN derived therefrom and a direct current IN correspondingly driven thereby.

A possible embodiment of an inverter DC/AC (here implemented by means of a so-called class-E-amplifier) is schematically shown in FIG. 6. The particular inverter DC/AC can be correspondingly activated, for example, by means of a control signal $NRG_{ACT}$ delivered by the, in given cases, provided, control unit ALU. With application of a measuring circuit monitoring the electrical current $I_x$ ($I_{S1}$, $I_{S2}$, . . . ) actually flowing on the output, or with application of a corresponding monitoring signal $NRG_{DIAG}$ delivered therefrom corresponding with the electrical current $I_x$, additionally, during operation, by means of the control unit, it can recurringly be detected, whether a measuring device S1, S2, . . . . Is actually connected to the particular connection system A1, A2 . . . . In case, based on a too low electrical current $I_x$, it is recognized, that the particular connection system A1, A2, . . . is not supplied with a measuring device, such can be turned off for preventing further energy losses. As, among other things, shown in the initially mentioned German patent application 102007020823.7, a class E amplifier can, with exploitation of its sectionally linear frequency response, be used also for the amplitude modulation, especially also for amplitude shift keying (ASK) and, insofar, the modulator can be embodied as an integral component of the inverter DC/AC.

Finally, it is to be noted that also the electrical coupling between distributor module and data processing unit, be it as regards the data transmission or as regards the energy supply, essentially can be embodied equally to that between distributor module and the individual measuring devices. In case required, for connecting the distributor module to the data processing unit, instead of an interface of the type being discussed implemented by means of connecting cables and plug connector coupling, for example, however, also a connecting cable connected via connection terminal fixedly with the distributor module can be used.

The invention claimed is:

1. A measuring system for measuring at least one physical and/or at least one chemical measured variable, comprising:
   a distributor module including:
   a module housing;
   an electronics module placed within the module housing;
      a first connection system including a first transformer coil and a first plug connector element, wherein the first transformer coil is connected with the electronics module and is placed within the first plug connector element, wherein the first plug connector element is formed as an integral component of the module housing and is composed of an electrically non-conductive plastic or synthetic material, wherein the first connection system is embodied to inductively couple with a first measuring device
      a second connection system including a second transformer coil and a second plug connector element, wherein the second transformer coil is connected with the electronics module and is placed within the second plug connector element, wherein the second plug connector element is formed as an integral component of the module housing and is composed of an electrically non-conductive plastic or synthetic material, wherein the second connection system is embodied to inductively couple with a second measuring device; and
      a third connection system including a third transformer coil and a third plug connector element, wherein the third transformer coil is connected with the electronics module and is placed within the third plug connector element, wherein the third plug connector element is formed as an integral component of the module housing and is composed of an electrically non-conductive plastic or synthetic material, wherein the third connection system is embodied to inductively couple with a superordinate data processing unit;
   a first measuring device measuring at least one physical and/or at least one chemical measured variable, and having a transformer coil and a plug connector element, wherein the transformer coil is disposed within the plug connector element, and the plug connector element is embodied complementary to the first plug connector element of the distributor module such that the plug connector element of the first measuring device and the first plug connector element of the distributor module form a releasable coupling, wherein the first measuring device is connected to the distributor module via the first connection system to form a first interface that serves for transmitting digital data and electrical energy by inductive coupling; and
   an superordinate data processing unit having a transformer coil and a plug connector element, wherein the transformer coil is disposed within the plug connector element, and the plug connector element is embodied complementary to the third plug connector element of the distributor module such that the plug connector element of the electronic data processing unit and the third plug connector element of the distributor module form a releasable coupling, wherein the electronic data processing unit is connected to the distributor module via the third connection system to form a third interface that serves for transmitting digital data and electrical energy by inductive coupling,
   wherein the electronics module is configured to receive electrical energy via the third connection system and distribute the received electrical energy to the first connection system and to the second connection system, and wherein the electronics module is further configured to route digital communication bidirectionally between the third connection system and the first connection system and bidirectionally between the third connection system and the second connection system.

2. The measuring system as claimed in claim 1, further comprising:
   a second measuring device measuring at least one physical and/or at least one chemical measured variable, and having a transformer coil and a plug connector element, wherein the transformer coil is disposed within the plug connector element, and the plug connector element is embodied complementary to the second plug connector element of the distributor module such that the plug connector element of the second measuring device and the second plug connector element of the distributor module form a releasable coupling, wherein the second measuring device is connected to the distributor module via the second connection system to form a second interface that serves for transmitting digital data and electrical energy by inductive coupling.

3. The measuring system as claimed in claim 2, wherein:
the second measuring device is a conductivity measuring device, which recurringly registers an electrical conductivity of a liquid; or
the second measuring device is a pressure measuring device, which recurringly registers a pressure of a fluid.

4. The measuring system as claimed in claim 2, wherein:
the second measuring device includes a potentiometric sensor, an amperometric sensor, a photometric sensor, a spectrometric sensor, a temperature sensor, a pressure sensor, a flow sensor, or a conductivity sensor.

5. The measuring system as claimed in claim 2, further comprising:
a fieldbus,
wherein the electronic data processing unit is communicatively connected with the fieldbus.

6. The measuring system as claimed in claim 2, wherein said superordinate data processing unit is remote from the distributor module and/or connected to a fieldbus.

7. The measuring system as claimed in claim 1, wherein said electronics module is embodied to meet requirements of the ignition protection type "Intrinsic Safety" (Ex-i).

8. The measuring system as claimed in claim 1, wherein the first interface that serves for transmitting digital data and electrical energy by inductive coupling is configured to transmit the digital data and the electrical energy simultaneously, and
wherein the third interface that serves for transmitting digital data and electrical energy by inductive coupling is configured to transmit the digital data and the electrical energy simultaneously.

9. The measuring system claimed in claim 1, wherein the module housing is embodied water spray- and/or explosion- and/or pressure resistantly in a manner meeting requirements of ignition protection type "Pressure-Resistant Encapsulation" (Ex-d).

* * * * *